United States Patent
Shim et al.

(10) Patent No.: US 10,626,288 B2
(45) Date of Patent: Apr. 21, 2020

(54) RESIN COMPOSITION FOR PRINTED CIRCUIT BOARD, RESIN VARNISH USING THE SAME, ADHESIVE FILM, PREPREG AND PRINTED WIRING BOARD

(71) Applicant: Samsung Electro-Mechanics Co., Ltd., Suwon-si (KR)

(72) Inventors: Ji-Hye Shim, Suwon-si (KR); Ki-Seok Kim, Incheon-si (KR); Ji-Eun Woo, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 502 days.

(21) Appl. No.: 14/949,177

(22) Filed: Nov. 23, 2015

(65) Prior Publication Data
US 2016/0208143 A1     Jul. 21, 2016

(30) Foreign Application Priority Data

Jan. 16, 2015 (KR) .................. 10-2015-0008237

(51) Int. Cl.
| | | |
|---|---|---|
| *C09D 163/00* | (2006.01) | |
| *C09J 163/00* | (2006.01) | |
| *H05K 3/46* | (2006.01) | |
| *C08K 5/10* | (2006.01) | |
| *C08K 5/315* | (2006.01) | |
| *C08G 59/58* | (2006.01) | |
| *C08K 3/36* | (2006.01) | |
| *H05K 1/02* | (2006.01) | |
| *C08K 5/00* | (2006.01) | |
| *C08L 63/00* | (2006.01) | |

(52) U.S. Cl.
CPC .......... *C09D 163/00* (2013.01); *C08G 59/58* (2013.01); *C08K 5/10* (2013.01); *C08K 5/315* (2013.01); *C09J 163/00* (2013.01); *H05K 3/4676* (2013.01); *C08K 3/36* (2013.01); *C08K 5/0025* (2013.01); *H05K 1/024* (2013.01)

(58) Field of Classification Search
CPC ........ C09D 163/00; C08G 59/58; C08K 5/10; C08K 5/315; C08K 3/36; C08K 5/0025; C09J 163/00; H05K 3/4676; H05K 1/024
USPC .................................................... 523/400
See application file for complete search history.

(56) References Cited

U.S. PATENT DOCUMENTS

| | | | | |
|---|---|---|---|---|
| 2009/0215943 A1* | 8/2009 | Hirose | .................. | C08G 59/32 524/405 |
| 2011/0139496 A1* | 6/2011 | Nakamura | ................ | B32B 7/12 174/256 |
| 2014/0349120 A1* | 11/2014 | Zeng | ........................ | C08J 5/24 428/416 |

\* cited by examiner

*Primary Examiner* — David T Karst
(74) *Attorney, Agent, or Firm* — NSIP Law

(57) ABSTRACT

A resin composition for a printed circuit board includes an epoxy resin; an active ester hardening agent configured to react with the epoxy resin; and a cyanate ester hardening agent.

17 Claims, 4 Drawing Sheets

10

RESIN COMPOSITION FOR PRINTED CIRCUIT BOARD, RESIN VARNISH USING THE SAME, ADHESIVE FILM, PREPREG AND PRINTED WIRING BOARD

CROSS REFERENCE TO RELATED APPLICATION(S)

This application claims the benefit of Korean Patent Application No. 10-2015-0008237 filed on Jan. 16, 2015 in the Korean Intellectual Property Office, the entire disclosure of which is incorporated herein by reference for all purposes.

BACKGROUND

1. Field

The following description relates to a resin composition for printed circuit boards and a resin varnish, an adhesive film, a prepreg and a printed wiring board using the same.

2. Description of Related Art

There is a large demand for electronic devices with greater capabilities, smaller sizes and higher speed as a result of the development of electronic industries.

In addition, there is a demand for a printed circuit board (PCB) having a low dielectric loss which is able to reduce losses of transmission signals while maintaining reliability in a high-frequency region.

An example of a PCB is disclosed in JP Patent Publication No. 2007-254710.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a resin composition for a printed circuit board includes: an epoxy resin; an active ester hardening agent configured to react with the epoxy resin; and a cyanate ester hardening agent.

The active ester hardening agent may include at least one of a phenol ester, a thiophenol ester or a N-hydroxylamine ester.

The cyanate ester hardening agent may be represented by the formula

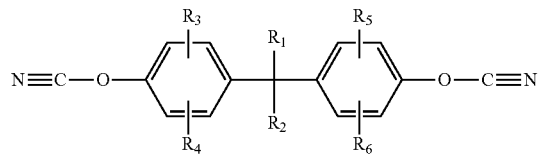

wherein R1 and R2 are the same or different, and are a hydrogen or a C1 to C3 alkyl group, and wherein R3 to R6 are the same or different, and are a hydrogen, a C1 to C3 alkyl group or a phenyl group.

R3 to R6 may be the same or different and may be a C1 to C3 alkyl group or a phenyl group.

A ratio of a total number of active ester groups of the active ester hardening agent to a total number of epoxy groups included in the resin composition may be about 0.3 to about 0.7.

The cyanate ester hardening agent may be about 30 wt % to about 50 wt % of a total weight of the epoxy resin and cyanate ester hardening agent.

A mole ratio of the active ester hardening agent to the cyanate ester hardening agent may be about 0.8 to about 1.0.

The epoxy resin may include at least one of a bisphenol A-type epoxy resin, a bisphenol F-type epoxy resin, a phenol novolak type epoxy resin, a tertiary-butyl-catechol type epoxy resin, a naphthalene type epoxy resin, a glycidylamine type epoxy resin, a cresol novolak type epoxy resin, a biphenyl type epoxy resin, a linear aliphatic epoxy resin, a cyclic aliphatic epoxy resin, a heterocyclic epoxy resin, a spirocyclic epoxy resin, a dicyclopentadiene epoxy resin, a cyclohexandimethane epoxy resin, a trimethylol type epoxy resin or a halogenated epoxy resin.

The inorganic filler may be about 50 vol % to about 70 vol % of a total volume of solids of the resin composition.

The resin composition may further include a thermoplastic resin.

A resin varnish may include the resin composition.
An adhesive film may include the resin composition.
A prepreg may include the resin composition.
A printed wiring board may include an insulation layer which is prepared by hardening the resin composition.

According to another general aspect, a method for preparing a printed wiring board includes: providing a core board, wherein a wiring layer is disposed on at least one side of the core board; forming an adhesive film by disposing a resin composition layer on a support, the resin composition layer comprising an epoxy resin, an active ester hardening agent configured to react with the epoxy resin, and a cyanate ester hardening agent; and forming an insulation layer by laminating the resin composition layer on the wiring layer and then thermal hardening the resin composition layer.

The active ester hardening agent may include at least one of a phenol ester, a thiophenol ester or a N-hydroxylamine ester; or the cyanate ester hardening agent may be represented by the formula

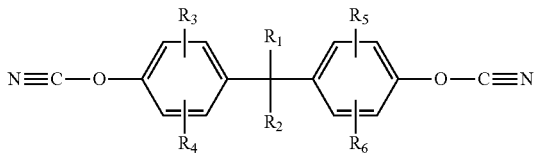

wherein R1 and R2 are the same or different and are a hydrogen or a C1 to C3 alkyl group, and R3 to R6 are the same or different and are a hydrogen, a C1 to C3 alkyl group or a phenyl group.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
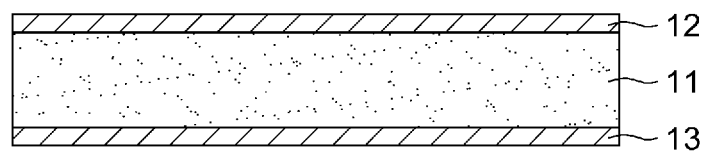
FIG. 1 is a sectional view illustrating an example of a metal clad laminate.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

According to an embodiment, a resin composition for printed circuit boards includes an epoxy resin, an active ester hardening agent which reacts with the epoxy resin, and a cyanate ester hardening agent.

According to another embodiment, in a resin composition for printed circuit boards including an epoxy resin and a phenol-based hardening agent, a hardening reaction of the epoxy resin and the phenol-based hardening agent provides a product having a hydroxy group (-OH) as shown in Scheme 1 below.

Scheme 1

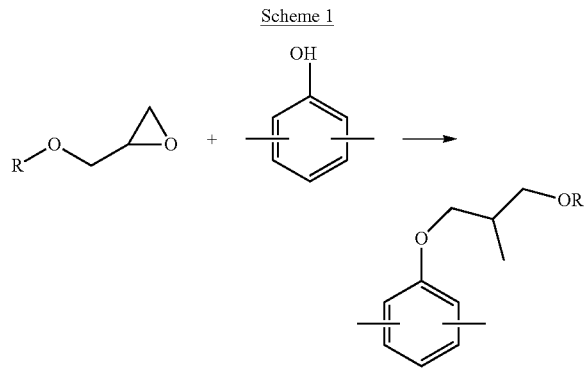

High electronegativity difference between O and H in the hydroxy group (—OH) results in high polarizability which further tends to increase dielectric loss.

When the polarizability is high, great amounts of energy are needed for a changed orientation of electrons to be reverted back to the original orientation under an electric field in a high frequency region and it further causes a lot of losses of transmission signals during this process.

Here, a resin composition for printed circuit boards according to an embodiment not only lowers polarizability but also reduces dielectric loss by including an epoxy resin and a mixed solution hardening agent of an active ester and a cyanate ester therein. The active ester and the cyanate ester do not produce hydroxy groups (—OH) through the reaction with the epoxy but produce a structure having ester groups or triazine groups having low polarizability so that they can reduce the dielectric loss.

The epoxy resin may not be limited to a particular type, as long as the epoxy resin provides desired effects of the present disclosure, and may be at least one of a bisphenol A-type epoxy resin, a bisphenol F-type epoxy resin, a phenol novolak type epoxy resin, a tertiary-butyl-catechol type epoxy resin, a naphthalene type epoxy resin, a glycidylamine type epoxy resin, a cresol novolak type epoxy resin, a biphenyl type epoxy resin, a linear aliphatic epoxy resin, a cyclic aliphatic epoxy resin, a heterocyclic epoxy resin, a spirocyclic epoxy resin, a dicyclopentadiene epoxy resin, a cyclohexandimethane epoxy resin, a trimethylol type epoxy resin or a halogenated epoxy resin.

Two or more of the epoxy resins may be combined and at least one thereof may be a biphenyl type epoxy resin.

The active ester hardening agent, according to an example, includes an ester group having high reactivity which is involved in the hardening reaction of the epoxy resin. The active ester hardening agent may not be limited to a particular type, so long as the active ester hardening agent provides desired effects of the present disclosure.

The active ester hardening agent may be at least one of a phenol ester, a thiophenol ester or a N-hydroxylamine ester.

The phenol ester may be provided through a condensation reaction of an aliphatic or aromatic carboxylic acid and a phenolic hydroxy group of a monohydric or polyhydric phenolic compound.

The active ester hardening agent obtainable from the aliphatic carboxylic acid may have an aliphatic chain which may increase solubility in organic solvents and compatibility with epoxy resins.

The active ester hardening agent obtainable from the aromatic carboxylic acid may have an aromatic ring which may improve heat resistance of resin compositions. The aromatic carboxylic acid may be one of benzene, naphthalene, biphenyl, diphenyl propane, diphenyl methane, diphenyl ether, diphenyl sulfone, benzophenone or the like of which 2 to 4 hydrogens on the aromatic ring are substituted by carboxylic groups (—COOH).

The monohydric phenolic compound may be one of the above-mentioned compounds of which one hydrogen on the aromatic ring is substituted by a hydroxy group (—OH). The polyhydric phenolic compound may be one of the above-mentioned compounds of which 2 to 4 hydrogens on the aromatic ring is substituted by a hydroxy group (—OH).

Examples of the aromatic carboxylic acid include phthalic acid, isophthalic acid, terephthalic acid, benzenetricarboxylic acid and the like.

Examples of the monohydric phenolic compound include phenol, cresol, a-naphthol, β-naphthol and the like. The polyhydric phenolic compound may be hydroquinone, resorcinol, catechol, 4,4'-biphenol, 4,4'-dihydroxydiphenyl ether, bisphenol A, bisphenol F, bisphenol S, bisphenol Z, brominated bisphenol A, brominated bisphenol F, brominated bisphenol S, methylated bisphenol S, dihydroxynaphthalene, dihydroxybenzophenone, trihydroxybenzophenone, tetrahydroxybenzophenone, phloroglycine and the like.

According to an example, the active ester hardening agent in the resin composition is added such that the ratio of the total number of active ester groups of the active ester hardening agent to the total number of epoxy groups included in the resin composition is about 0.3 to about 0.7. The total number of epoxy groups included in the resin composition may be a sum of values obtained by dividing a mass of each epoxy resin by each epoxide equivalent weight. The total number of active ester groups of the active ester hardening agent may be a sum of values obtained by dividing mass of each active ester hardening agent by an active ester group equivalent weight. When the amount of the active ester hardening agent deviates from the above range, hardening of the epoxy resin becomes insufficient, and heat resistance and chemical resistance of the hardened product become deteriorated.

According to an embodiment, both the active ester hardening agent and the cyanate ester hardening agent are added.

A resin composition according to an embodiment includes a mixed solution hardening agent of the active ester and the cyanate ester to reduce dielectric loss, increase peel strength, and improve processability.

When a resin composition according to another embodiment includes only an active ester hardening agent but not a cyanate ester hardening agent, the reduction of dielectric loss is limited.

When a resin composition for printed circuit boards in another embodiment includes only a cyanate ester hardening agent but not an active ester hardening agent, dielectric loss may be lowered but peel strength may be decreased, which further deteriorates adhesion to a wiring layer, and processability may also be deteriorated due to residues during forming of via holes.

On the other hand, when a resin composition according to an embodiment includes an epoxy resin and a mixed solution hardening agent of an active ester and a cyanate ester, processability and peel strength may be increased to improve adhesion with a wiring layer and dielectric loss may be significantly lowered. Accordingly, the resin composition according to an embodiment is appropriate to use as an insulating material of printed circuit boards and a printed circuit board prepared therefrom may therefore effectively reduce loss of transmission signals.

The cyanate ester (CE) hardening agent according to an embodiment includes a cyanate group which is involved in the hardening reaction and may not be limited to a particular type as long as it provides desired effects of the present disclosure. The cyanate ester hardening agent may self-polymerize by itself so that the cyanates react with each other to form a triazine group ring. This self-polymerization may contribute to improving heat resistance.

The cyanate ester hardening agent may be represented, for example, by Ar(OCN)m, wherein m is an integer of 2 to 5 and Ar is an aromatic radical. The aromatic radical Ar may be induced, for example, from an aromatic hydrocarbon such as benzene, biphenyl, naphthalene, anthracene, pyrene and the like. The aromatic radical may be induced from a polynuclear aromatic hydrocarbon in which 2 or more aromatic rings are connected through a crosslinking group.

The cyanate ester hardening agent may be represented, for example, by Formula 1 below, Formula 1

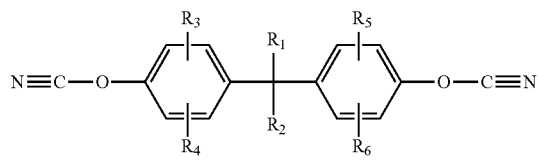

wherein R1 and R2 are the same or different, and a hydrogen or a C1 to C3 alkyl group, and R3 to R6 are the same or different, and a hydrogen and a C1 to C3 alkyl group or phenyl group.

When the active ester hardening agent and the cyanate ester hardening agent are used together, it may be difficult to ensure stable processability due to reactivity difference since the active ester hardening agent has slower reaction rate compared to the cyanate ester hardening agent. Thus, R3 to R6 in formula 1 may be a C1 to C3 alkyl group or a phenyl group in order to delay a reaction rate of the cyanate ester hardening agent to have similar reactivity to that of the active ester hardening agent.

For example, the cyanate ester hardening agent may be represented by any one of the following Formulas 2-4.

Formula 2

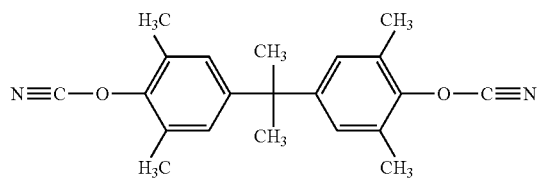

Formula 3

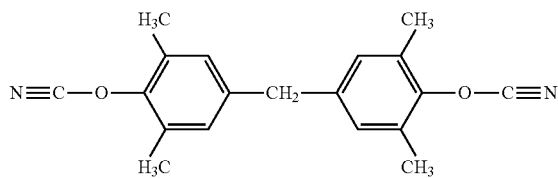

Formula 4

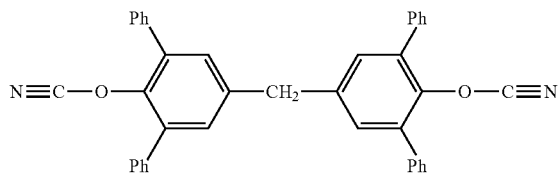

Each of R3 to R6 in Formula 1 may be a C1 to C3 alkyl group or a phenyl group, but is not limited thereto.

When the cyanate ester hardening agent is represented by any one of Formulas 2-4 or a compound of Formula 1 in which R3 to R6 is a C1 to C3 alkyl group or a phenyl group, the reactivity of the cyanate ester hardening agent may be similar to that of the active ester hardening agent to provide a uniform reaction.

According to an embodiment, the cyanate ester hardening agent in the resin composition may be used in an amount of about 30 wt % to about 50 wt % based on a total amount of the epoxy resin and the cyanate ester hardening agent. When the amount of the cyanate ester hardening agent deviates from the aforementioned range, hardening of the epoxy resin becomes insufficient, heat resistance and chemical resistance of the hardened product become deteriorated, and precipitates are formed in a resin varnish including the resin composition.

The active ester hardening agent may be used in a mole ratio of about 0.8 to 1.0 about with respect to the cyanate ester hardening agent. When the mole ratio of the cyanate ester hardening agent and the active ester hardening agent deviates from this range, it may cause deteriorated dielectric loss, peel strength, and adhesion to wiring layers.

According to an embodiment, the resin composition further includes an inorganic filler. The inorganic filler may be at least one of silica, alumina, talc, aluminum hydroxide, magnesium hydroxide, titanium oxide, mica, aluminum borate, barium sulfate, calcium carbonate, clay, magnesium carbonate, magnesium oxide, boron nitride, aluminum borate, barium titanate, strontium titanate, calcium titanate, magnesium titanate, bismuth titanate, barium zirconate, or calcium zirconate, but it is not limited thereto. When 2 or more inorganic fillers are combined and used, the inorganic fillers may include silica, preferably amorphous silica, fused silica, crystalline silica, synthetic silica or the like. The silica may be circular.

An average diameter of the inorganic filler may be, for example, about 0.05 μm to about 1 μm. When the average diameter of the inorganic filler is less than about 0.05 μm, viscosity of a resin varnish including the resin composition may increase and handling may be deteriorated. On the other hand, when the average diameter of the inorganic filler is greater than about 1 μm, it may deteriorate the peel strength to wiring layers. The average diameter of the inorganic filler may be determined using a diffraction method based on Mie scattering theory.

The inorganic filler may be treated with at least one surface treatment agent selected from an epoxysilane coupling agent, an aminosilane coupling agent, or a titanate coupling agent in order to improve moisture resistance and dispersibility.

Examples of the epoxysilane coupling agent include glycidoxy-ropyltrimethoxysilane, glycidoxypropyltriethoxysilane, glycidoxypropymethyldiethoxysilane and the like but it is not limited thereto. Examples of the aminosilane coupling agent may include aminopropyltrimethoxysilane, aminopropyltriethoxysilane, 3-phenylaminopropyltrimethoxysilane, N-2(aminoethyl)aminopropyltrimethoxysilane and the like but it is not limited thereto. Examples of the titanate coupling agent include isopropyltricumylphenyltitanate, isopropyl-triisostearoyltitanate, isopropyltridodecylbensensulfonyltitanate and the like, but are not limited thereto.

According to an embodiment, the inorganic filler in the resin composition may be added in an amount of about 50 vol % to about 70 vol % based on a total volume of solids of the resin composition.

When the amount of the inorganic filler is less than about 50 vol %, the thermal expansion coefficient and dielectric loss may increase, while when the amount of the inorganic filler is more than about 70 vol %, flexibility of an insulating resin using this inorganic filler may decrease and thereby cause unfilled portions during formation of the insulating resin in a wiring layer.

According to an embodiment, the resin composition further includes a thermoplastic resin. The thermoplastic resin may not be limited to a particular type, and examples include phenoxy resin, polyvinylacetal resin, polyimide resin, polyamideimide resin, polyethersulfone resin, polysulfone resin and the like. Examples of the phenoxy resin include a structure selected from bisphenol A type, bisphenol F type, bisphenol S type, bisphenolacetophenone, novolak, biphenyl type, fluorene, dicyclopentadiene, norbornene, naphthalene type, anthracene, adamantane, terpene, trimethylcyclohexane and the like. Two or more thermoplastic resins may be used together.

The thermoplastic resin may have a weight average molecular weight of about 8000 to about 70000. When the molecular weight of the thermoplastic resin is less than about 8000, peel strength to a wiring layer may become deteriorated, while when it is more than about 70000, thermal expansion coefficient and roughness may increase.

The resin composition may further include additives such as a hardening catalyst, a flame retardant, an antioxidant, a thickening agent, a leveling agent, a coloring agent and the like in a range to provide desired effects of the present disclosure.

The hardening catalyst may be a catalyst to catalyze the hardening reaction between the epoxy resin, and the active ester and the cyanate ester as a hardening agent. Examples of the hardening catalyst include organic metal salts of Zn, Cu, Fe and the like with an organic acid such as octanoic acid, stearic acid, acetylacetonate, naphthenic acid, salicylic acid and the like, tertiary amines such as triethylamine, triethanolamine and the like and imidazoles such as 2-ethyl-4-imidazole, 4-methylimidazole and the like. Two or more hardening catalysts may be used together.

Examples of the flame retardant include an organophosphorous flame retardant, an organic nitrogen-containing phosphorus compound, a nitrogen compound, a Si-based flame retardant, a halogen-based flame retardant, a metal hydroxide and the like. Two or more flame retardants may be used together.

The resin composition according to an embodiment may be widely used as insulating resin sheets such as adhesive films and prepregs, printed wiring boards, solder resists, underfill materials, die-bonding materials, semiconductor sealing materials, hole-filling resins, and component-filling resins in applications in which a resin composition is used. However, the disclosed resin composition is not limited these uses.

According to another embodiment, a resin varnish includes an epoxy resin, an active ester hardening agent, and a cyanate ester hardening agent and, if needed, further additives such as an inorganic filler, a thermoplastic resin or the like in a solvent.

The resin varnish may be prepared by dissolving the resin composition in a solvent, for example mixing and stirring through one of ultrasonic dispersion, high pressure collisional dispersion, high speed rotational dispersion, beads milling, high speed shearing dispersion, planetary dispersion and the like. Examples of the solvent include methyl ethyl ketone, xylene, toluene, acetone, ethyleneglycol monoethyl ether, cyclohexanone, ethylethoxy propionate, N,N-dimethylformamide, N,N-dimethylacetamide, ethyl acetate, butyl acetate, cellosolve acetate, propylenglycolmonomethyl ether acetate, carbitol aceate, propyleneglycol monomethyl ether, N-methylpyrrolidone and a mixed solution thereof, but are not limited thereto. The resin varnish may be used in an amount of about 20 wt % to about 70 wt % of solid, excluding the solvent for coating.

According to another embodiment, a prepreg is prepared by impregnating the resin composition in a fiber material.

The prepreg may be prepared by impregnating the resin composition in a fiber material using a hot-melt method or a solvent method, and then drying and half-hardening the resulting structure. Examples of the fiber material include glass cloth, aramid cloth, polyester cloth, non-woven glass, non-woven aramid, non-woven polyester, pulp paper, linter paper and the like.

When a glass cloth, preferably a flat glass cloth, is used, it may provide a laminate with excellent mechanical strength. Flatness of the glass cloth is provided by continuously compressing the glass cloth with a press roll at an appropriate pressure to be flat.

Thickness of the fiber material may be, for example, about 0.04 mm to about 0.3 mm.

The hot-melt method is a method for preparing a prepreg by coating a resin composition, which is not dissolved in a solvent, on a coated paper having good detachability and then laminating or directly coating the result to a fiber material with a die coater.

The solvent method is a method for preparing a prepreg by immersing fiber material in the resin varnish, which is prepared by dissolving a resin composition in a solvent, to impregnate the resin varnish to the fiber material and then drying the result.

A double-sided metal foil clad laminate or a single-sided metal foil clad laminate may be prepared by laminating one or more prepregs, stacking metal foil(s) such as copper foil on the both sides or one side, and thermocompression molding the resulting structure to unite layers. Conditions of thermocompression may vary with thickness and/or the kind of resin composition of a laminate or a prepreg to be prepared.

FIG. 1 is a sectional view illustrating a metal clad laminate 10 according to an embodiment.

Referring to FIG. 1, the metal clad laminate 10 includes a core 11 formed by laminating a prepreg, and metal foils 12, 13 laminated on both sides of the core.

According to another embodiment (see FIG. 2B), an adhesive film is prepared by coating the resin varnish on a support and drying a solvent with heat or hot-air to form a resin composition layer. The drying condition is not particularly limited. An amount of the solvent of the resin composition layer may be, for example, about 10 wt % or less.

A thickness of the resin composition layer included in the adhesive film may be thicker than that of a wiring layer. Since the thickness of the wiring layer in a printed wiring board is about 5 μm to about 70 μm, the thickness of the resin composition layer may be about 10 μm to about 100 μm.

Examples of the support include: polyolefins such as polyethylene, polypropylene, and polyvinyl chloride; polyesters such as polyethyleneterephthalate (PET) and polyethylenephthalate; plastic films such as polycarbonate and polyimide; and the like.

An adhesive film may be also prepared as the support using a metal foil such as copper foil, aluminum foil and the like.

A thickness of the support may be about 10 μm to about 150 μm but it is not limited thereto.

The support may be laminated on a printed wiring board and then stripped out using hardening after an insulation layer is formed.

According to another embodiment, a printed wiring board includes an insulation layer formed by hardening the resin composition.

FIGS. 2A-2E illustrate a method for preparing a printed wiring board according to an embodiment of the present disclosure.

Figure 2A:
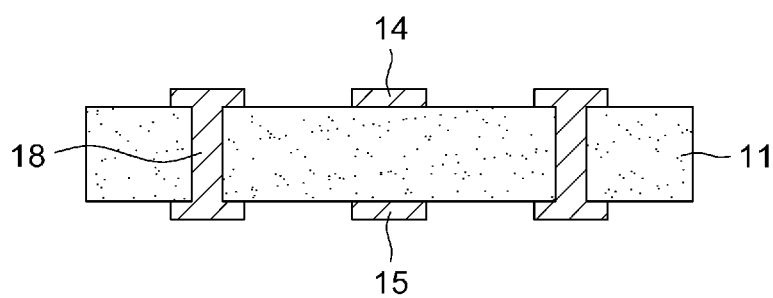
FIGS. 2A-2E illustrate an example of a method for preparing a printed wiring board.

Referring to FIG. 2A, a core board, in which wiring layers 14, 15 are formed on the both sides of the core 11, is prepared. The core board may not be limited to a particular type and, for example, may be an insulation board including a wiring layer on at least one side.

The wiring layers 14, 15 may be formed by etching unnecessary parts of the metal foils 12, 13 of the metal clad laminate 10 but are not limited to being formed by such an etching process. The wiring layers 14, 15 are connected through via holes 18 which pass through the core 11.

Figure 2B:
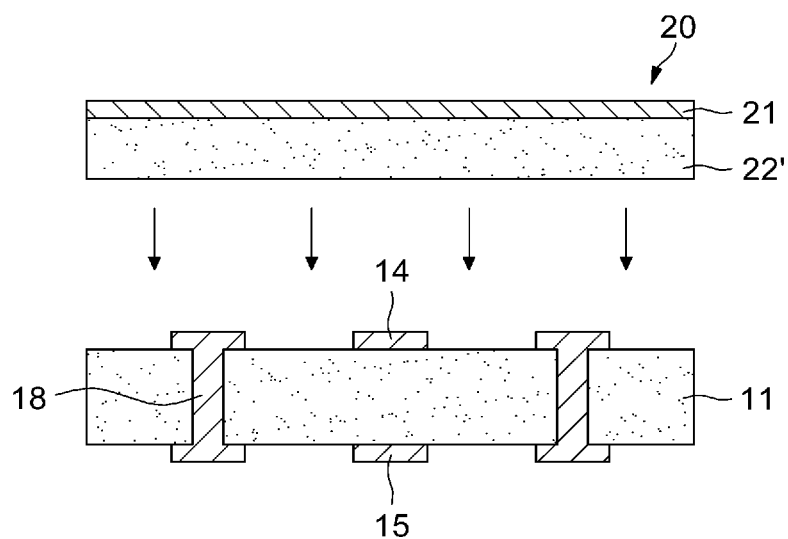

Referring to FIG. 2B, an adhesive film 20 may be formed by disposing a resin composition layer 22' on a support 21. Other constructs may be used in place of the adhesive film 20. For example, a prepreg formed on a carrier film may be also used.

Figure 2C:
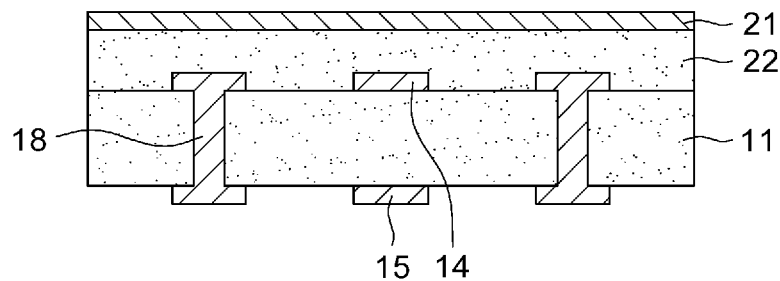

Referring to FIG. 2C, an insulation layer 22 is formed by laminating the resin composition layer 22' on the wiring layer 14 through a lamination method or a press method and then thermal hardening the resulting structure.

Figure 2D:
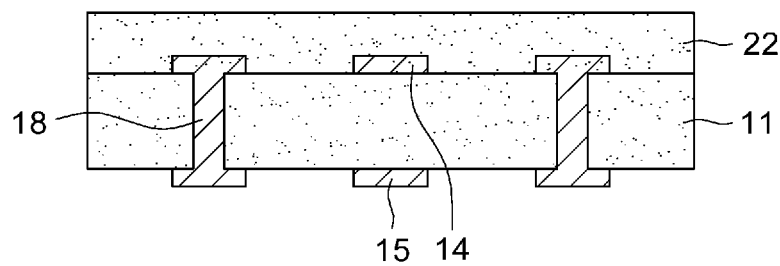

Referring to FIG. 2D, after the adhesive film 20 is laminated and the insulation layer 22 is formed thereon through thermal hardening, the support 21 is stripped off.

Figure 2E:
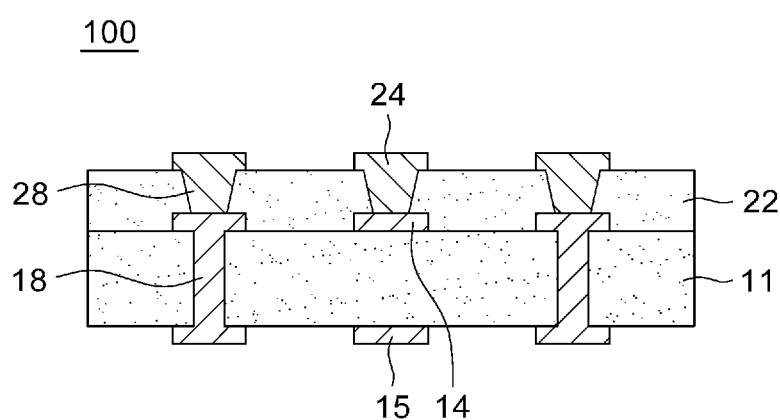

Referring to FIG. 2E, a wiring layer 24 is formed on the insulation layer 22 through a plating process and via holes 28 which connect the inner wiring layer 14 and the wiring layer 24 on the insulation layer 22 are formed to provide a printed wiring board 100.

A multilayer printed wiring board may be formed by repeating the processes of FIGS. 2B-2E. FIGS. 2A-2E only illustrate a process for preparing a printed wiring board laminated on one side, but are not limited thereto. That is, the insulation layer and the wiring layer may be formed on the both sides of the core board.

Hereinafter, although more detailed descriptions will be given by examples, the following examples are only for explanation and there is no intention to limit the disclosure.

EXAMPLE 1

A cresol novolak epoxy resin (epoxide equivalent weight 206, produced by Kukdo Chemicals, 'YDCN-500-8p') 2.5% by weight, a naphthalene type epoxy resin (epoxide equivalent weight 151, produced by DIC Co., 'HP4032') 3.4% by weight, a bisphenol A-type cyanate ester 2.5% by weight (cyanate equivalent weight 234, produced by Lonza, 'BA-3000S', a methyl ethyl ketone solution with 75 wt % of a non-volatile content (hereinafter referred to as 'MEK')), an amino triazine group phenol novolak hardening agent (phenol equivalent weight 148, produced by Gun Ei Chemicals, PS-6313) 1.6% by weight, and an active ester hardening agent (ester equivalent weight 223, produced by DIC Co., HPC-8000-65T) 10.9% by weight were added to a silica slurry (Admah Tex Co., 'SC2050-MTE', a MEK solution with 70 wt % of a non-volatile content) 74.8% by weight. The mixed solution was mixed and dispersed uniformly with a high speed mixer. Dimethylaminopyridine 0.4% by weight was added to the mixed solution to provide a resin varnish.

The resin varnish was coated on polyethylene terephthalate (thickness 38 μm, hereinafter referred to as 'PET') with a die coater to have a thickness of 20 μm after dry. The result was dried at 80° C. for 5 minutes (amount of residue solvent: about 2 wt %).

A polypropylene film with a thickness of 15 pm was adhered on the surface of the resin composition and rolled. The rolled adhesive film was slit to 494 mm wide to be a size of 494×395 mm.

Figure 3:
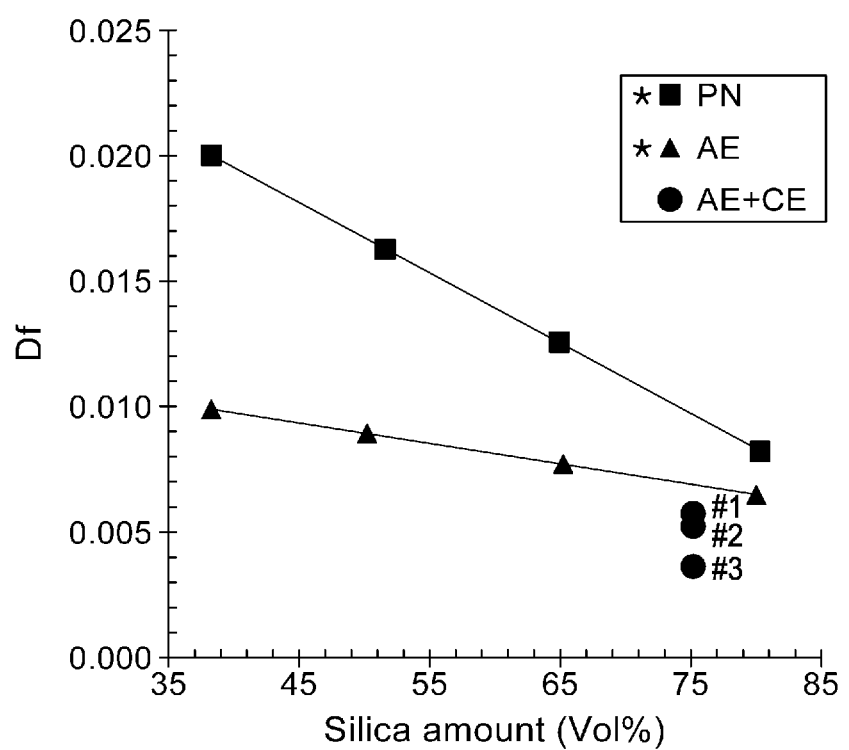
FIG. 3 is a graph illustrating dielectric loss factors (Df) depending on an amount of silica when a phenol novolak (PN) hardening agent, an active ester (AE) hardening agent, and a mixed solution hardening agent of an active ester and a cyanate ester are used, respectively, according to an example.

A dielectric loss factor (Df) of the adhesive film prepared in Example 1 is shown as #1 in FIG. 3.

EXAMPLE 2

A cresol novolak epoxy resin (epoxide equivalent weight 206, produced by Kukdo Chemicals 'YDCN-500-8p') 4.9% by weight, a bisphenol A-type cyanate ester (cyanate equivalent weight 234, produced by Lonza'BA-3000S', a MEK solution with 75 wt % of a non-volatile content) 4.9% by weight, and an active ester hardening agent (ester equivalent weight 223, produced by DIC Co., HPC-8000-65T) 10.9% by weight were added to a silica slurry (Admah Tex Co., 'SC2050-MTE', a MEK solution with 70 wt % of a non-volatile content) 74.8% by weight. The mixed solution was mixed and dispersed uniformly with a high speed mixer. Dimethylaminopyridine 0.4% by weight was added to the mixed solution to provide a resin varnish. Then, the same process described in Example 1 was carried out.

A dielectric loss factor (Df) of the adhesive film prepared in Example 2 is shown as #2 in FIG. 3.

EXAMPLE 3

A cresol novolak epoxy resin (epoxide equivalent weight 206, produced by Kukdo Chemicals 'YDCN-500-8p') 4.4% by weight, a bisphenol A-type cyanate ester (cyanate equivalent weight 234, produced by Lonza'BA-3000S', a MEK solution with 75 wt % of a non-volatile content) 4.4% by weight, and active ester hardening agent (ester equivalent weight 223, produced by DIC Co., HPC-8000-65T) 12.7% by weight were added to a silica slurry (Admah Tex Co., 'SC2050-MTE', a MEK solution with 70 wt % of a non-volatile content) 74.8% by weight. The mixed solution was mixed and dispersed uniformly with a high speed mixer. Dimethylaminopyridine 0.4% by weight was added to the mixed solution to provide a resin varnish. Then, the same process described in Example 1 was carried out.

A dielectric loss factor (Df) of the adhesive film prepared in Example 3 is shown as #3 in FIG. 3.

COMPARATIVE EXAMPLE 1

An amino triazine group phenol novolak (PN) hardening agent (phenol equivalent weight 148, produced by Gun Ei Chemicals PS-6313), of which an amount was 0.6 equivalent weight with respect to a total epoxy equivalent weight, was added to a cresol novolak epoxy resin (epoxide equivalent weight 206, produced by Kukdo Chemicals 'YDCN-500-8p') 2.5% by weight, a naphthalene type epoxy resin (epoxide equivalent weight 151, produced by DIC Co., 'HP4032') 3.4% by weight. A silica slurry (Admah Tex Co., 'SC2050-MTE', a MEK solution with 70 wt % of a non-volatile content) with various amount was added to the mixed solution. The mixed solution was mixed and dispersed uniformly with a high speed mixer. Dimethylaminopyridine 0.4% by weight was added to the mixed solution to provide a resin varnish. Then, the same process described in Example 1 was carried out.

The amount of the silica slurry was 37.1% by weight, 49.5% by weight, 65.1% by weight and 80.7% by weight. Dielectric loss factors (Df) of the adhesive film prepared in Comparative Example 1 is shown as PN in FIG. 3.

COMPARATIVE EXAMPLE 2

An active ester (AE) hardening agent (ester equivalent weight 223, produced by DIC Co., HPC-8000-65T), of which an amount was 1.0 equivalent weight with respect to a total epoxy equivalent weight, was added to a cresol novolak epoxy resin (epoxide equivalent weight 206, produced by Kukdo Chemicals 'YDCN-500-8P') 2.5% by weight and a naphthalene type epoxy resin (epoxide equivalent weight 151, produced by DIC Co., 'HP4032') 3.4% by weight. A silica slurry (Admah Tex Co., 'SC2050-MTE', a MEK solution with 70 wt % of a non-volatile content) with various amount was added to the mixed solution. The mixed solution was mixed and dispersed uniformly with a high speed mixer. Dimethylaminopyridine 0.4% by weight was added to the mixed solution to provide a resin varnish. Then, the same process described in Example 1 was carried out.

The amount of the silica slurry was 37.1% by weight, 49.5% by weight, 65.1% by weight and 80.7% by weight. Dielectric loss factors (Df) of the adhesive film prepared in Comparative Example 2 is shown as AE in FIG. 3.

EXAMPLE 4

A mole ratio of an active ester hardening agent (ester equivalent weight 223, produced by DIC Co., HPC-8000-65T) and a bisphenol A-type cyanate ester (cyanate equivalent weight 234, produced by Lonza'BA-3000S', a MEK solution with 75 wt % of a non-volatile content) was 0.3:1.0. Except for this, the same process described in Example 1 was carried out.

Figure 4:
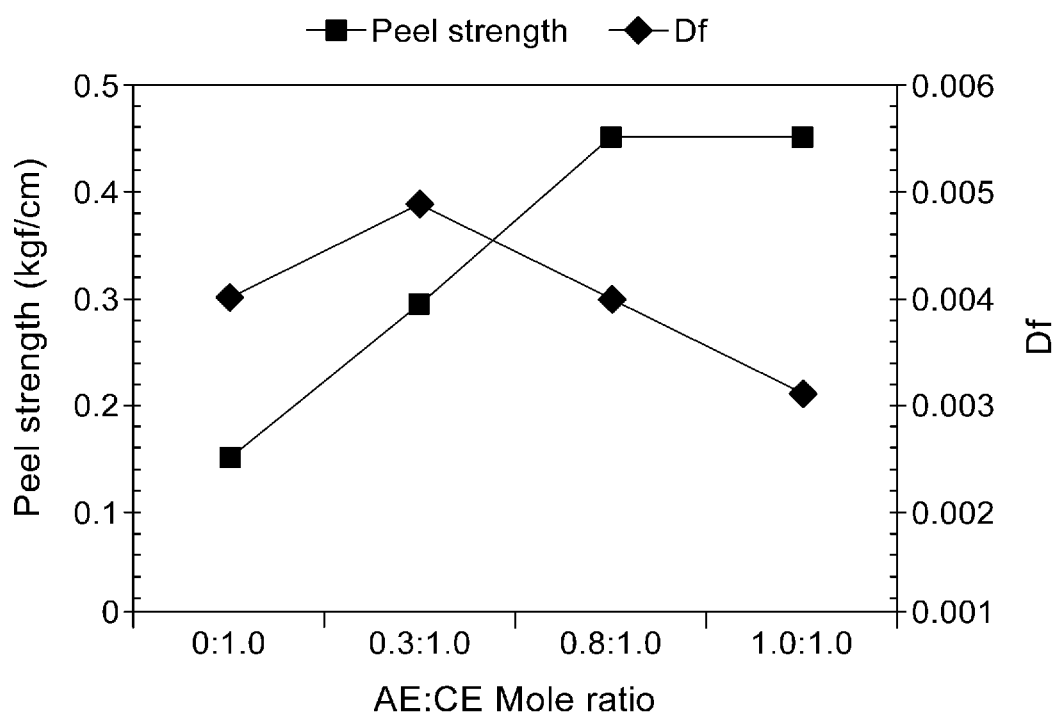
FIG. 4 is a graph illustrating peel strengths and dielectric loss factors (Df) depending on a mole ratio of an active ester and a cyanate ester, according to an example.

Peel strength and dielectric loss factor (Df) of the adhesive film prepared in Example 4 is shown in FIG. 4.

EXAMPLE 5

A mole ratio of an active ester hardening agent (ester equivalent weight 223, produced by DIC Co., HPC-8000-65T) and a bisphenol A-type cyanate ester (cyanate equivalent weight 234, produced by Lonza'BA-3000S', a MEK solution with 75 wt % of a non-volatile content) was 0.8:1.0. Except for this, the same process described in Example 1 was carried out.

Peel strength and dielectric loss factor (Df) of the adhesive film prepared in Example 5 is shown in FIG. 4.

EXAMPLE 6

A mole ratio of an active ester hardening agent (ester equivalent weight 223, produced by DIC Co., HPC-8000-65T) and a bisphenol A-type cyanate ester (cyanate equivalent weight 234, produced by Lonza'BA-3000S', a MEK solution with 75 wt % of a non-volatile content) was 1.0:1.0. Except for this, the same process described in Example 1 was carried out.

Peel strength and dielectric loss factor (Df) of the adhesive film prepared in Example 6 is shown in FIG. 4.

COMPARATIVE EXAMPLE 3

The same process described in Example 1 was carried out, except not adding an active ester hardening agent (ester equivalent weight 223, produced by DIC Co., HPC-8000-65T).

Peel strength and dielectric loss factor (Df) of the adhesive film prepared in Comparative Example 3 is shown in FIG. 4.

FIG. 3 is a graph illustrating dielectric loss factors (Df) depending on the amount of silica when a phenol novolak (PN) hardening agent, an active ester (AE) hardening agent, and a mixed solution hardening agent of an active ester (AE) and a cyanate ester (CE) are used, respectively.

Referring to FIG. 3, it is noted that when only the phenol novolak (PN) hardening agent was used (Comparative Example 1), the dielectric loss factor (Df) was high. This is why the phenol novolak hardening agent, which is a phenol-based hardening agent, reacts with the epoxy resin and generates hydroxy groups (—OH) which increase polarizability.

On the other hand, it is noted that when only the active ester (AE) hardening agent was used (Comparative Example 2), the amount by which the dielectric loss factor (Df) can be lowered by only increasing the amount of silica is limited.

However, it is noted that when the mixed solution hardening agent of the active ester and the cyanate ester (AE+CE) was used (Example 1 to Example 3), the dielectric loss factor (Df) was decreased compared to those of Comparative Example 1 and Comparative Example 2 at the same amount of silica.

FIG. 4 is a graph illustrating peel strengths and dielectric loss factors (Df) depending on the mole ratio of an active ester and a cyanate ester.

Referring to FIG. 4, it is noted that when only the cyanate ester (CE) hardening agent was used (Comparative Example 3), the dielectric loss factor (Df) was low but the peel strength was very low. It is further noted that when only the cyanate ester (CE) hardening agent is used (Comparative Example 3), the adhesion to wiring layers becomes very deteriorated so that it is not appropriate to use as an insulation layer of a printed wiring board.

On the other hand, it is noted that when a mole ratio of the active ester hardening agent to the cyanate ester hardening agent was 0.8 to 1.0 (Examples 5 and 6), the peel strength was good while the dielectric loss factor (Df) was low.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF REFERENCE NUMERALS

10: Metal clad laminate
11: Core
12, 13: Metal foil
14, 15, 24: Wiring layer
20: Adhesive film
21: Support
22': Resin composition layer
22: Insulation layer
18, 28: Via holes

What is claimed is:
1. A resin composition for a printed circuit board comprising:
an epoxy resin;
an active ester hardening agent configured to react with the epoxy resin; and
a cyanate ester hardening agent,
wherein:
the cyanate ester hardening agent is represented by the formula

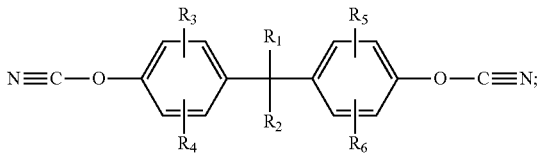

R1 and R2 are the same or different, and are a hydrogen or a C1 to C3 alkyl group; and
at least one of R3 to R6 is different from another of R3 to R6, R3 to R6 are a hydrogen or a C1 to C3 alkyl group or a phenyl group, and at least one of R3 to R6 is a phenyl group.

2. The resin composition of claim 1, wherein the active ester hardening agent comprises at least one of a phenol ester, a thiophenol ester or a N-hydroxylamine ester.

3. The resin composition of claim 1, wherein R3 to R6 are a C1 to C3 alkyl group or a phenyl group.

4. The resin composition of claim 1, wherein a ratio of a total number of active ester groups of the active ester hardening agent to a total number of epoxy groups included in the resin composition is about 0.3 to about 0.7.

5. The resin composition for printed circuit boards of claim 1, wherein the cyanate ester hardening agent is about 30 wt% to about 50 wt% of a total weight of the epoxy resin and cyanate ester hardening agent.

6. The resin composition of claim 1, wherein the epoxy resin comprises at least one of a bisphenol A-type epoxy resin, a bisphenol F-type epoxy resin, a phenol novolak type epoxy resin, a tertiary-butyl-catechol type epoxy resin, a naphthalene type epoxy resin, a glycidylamine type epoxy resin, a cresol novolak type epoxy resin, a biphenyl type epoxy resin, a linear aliphatic epoxy resin, a cyclic aliphatic epoxy resin, a heterocyclic epoxy resin, a spirocyclic epoxy resin, a dicyclopentadiene epoxy resin, a cyclohexandimethane epoxy resin, a trimethylol type epoxy resin or a halogenated epoxy resin.

7. The resin composition of claim 1, further comprising an inorganic filler.

8. The resin composition of claim 7, wherein the inorganic filler comprises at least one of silica, alumina, talc, aluminum hydroxide, magnesium hydroxide, titanium oxide, mica, aluminum borate, barium sulfate, calcium carbonate, clay, magnesium carbonate, magnesium oxide, boron nitride, barium titanate, strontium titanate, calcium titanate, magnesium titanate, bismuth titanate, barium zirconate, or calcium zirconate.

9. The resin composition of claim 7, wherein the inorganic filler is about 50 vol% to about 70 vol% of a total volume of solids of the resin composition.

10. The resin composition of claim 1, further comprising a thermoplastic resin.

11. A resin varnish comprising the resin composition of claim 1.

12. An adhesive film comprising the resin composition of claim 1.

13. A prepreg comprising the resin composition of claim 1.

14. A printed wiring board comprising an insulation layer which is prepared by hardening the resin composition of claim 1.

15. A method for preparing a printed wiring board, comprising:
- providing a core board, wherein a wiring layer is disposed on at least one side of the core board;
- forming an adhesive film by disposing the resin composition of claim 1 on a support; and
- forming an insulation layer by laminating the resin composition layer on the wiring layer and then thermal hardening the resin composition layer.

16. The resin composition of claim 1, wherein a mole ratio of the active ester hardening agent to the cyanate ester hardening agent is about 0.8:1.0.

17. The resin composition of claim 1, wherein the resin composition has a dielectric loss factor (Df) of less than 0.006 and a peel strength of greater than or equal to 0.3 kgf/cm.

* * * * *